United States Patent
Ko

(10) Patent No.: US 7,348,669 B2
(45) Date of Patent: Mar. 25, 2008

(54) BUMP STRUCTURE OF SEMICONDUCTOR DEVICE AND METHOD OF MANUFACTURING THE SAME

(75) Inventor: Young-pil Ko, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/339,774

(22) Filed: Jan. 25, 2006

(65) Prior Publication Data

US 2006/0170102 A1    Aug. 3, 2006

(30) Foreign Application Priority Data

Jan. 28, 2005  (KR) .................. 10-2005-007984

(51) Int. Cl.
*H01L 23/48*   (2006.01)

(52) U.S. Cl. ............... 257/737; 257/738; 257/750; 257/780

(58) Field of Classification Search ............. 257/734, 257/738, 780, 781, 778, E23.021, 750; 156/242; 428/629; 438/613, 629, 106; 324/755
See application file for complete search history.

(56) References Cited

U.S. PATENT DOCUMENTS

| | | | | |
|---|---|---|---|---|
| 3,900,359 A | * | 8/1975 | Bakewell | ............... 156/242 |
| 5,289,038 A | * | 2/1994 | Amano | ............... 257/780 |
| 5,793,117 A | * | 8/1998 | Shimada et al. | ............ 257/780 |
| 5,834,945 A | * | 11/1998 | Akram et al. | ............... 324/755 |
| 5,902,686 A | * | 5/1999 | Mis | ............... 428/629 |
| 6,107,119 A | * | 8/2000 | Farnworth et al. | .......... 438/106 |
| 6,177,352 B1 | * | 1/2001 | Schonfeld et al. | .......... 438/701 |
| 6,750,551 B1 | * | 6/2004 | Frutschy et al. | ............ 257/785 |
| 2001/0020745 A1 | * | 9/2001 | Jiang et al. | ................. 257/778 |

FOREIGN PATENT DOCUMENTS

| KR | 10-2002-0091470 | 12/2002 |
|---|---|---|
| KR | 10-2003-0016914 | 3/2003 |

OTHER PUBLICATIONS

Zeccino et al. Accurate thick film measurements with Optical Profiling, Veeco Instruments Inc., Application Notes #AN512-1-0104, 2004.*

* cited by examiner

*Primary Examiner*—Jerome Jackson
*Assistant Examiner*—Jami M Valentine
(74) *Attorney, Agent, or Firm*—Mills & Onello LLP

(57) ABSTRACT

In connection with a bump of a semiconductor device and a manufacturing method thereof, a groove is formed in a bump pad region of a semiconductor substrate. An under bump metal layer is then formed in the groove, and a lower end portion of the bump fills the groove on the under bump metal layer.

21 Claims, 7 Drawing Sheets

BUMP STRUCTURE OF SEMICONDUCTOR DEVICE AND METHOD OF MANUFACTURING THE SAME

CROSS-REFERENCE TO RELATED PATENT APPLICATION

This application claims the benefit of Korean Patent Application No. 10-2005-0007984, filed on Jan. 28, 2005, in the Korean Intellectual Property Office, the disclosure of which is incorporated herein in its entirety by reference.

BACKGROUND OF THE INVENTION

1. Field of the Invention

The present invention relates to a semiconductor device, and more particularly to a bump for an electrical connection in a semiconductor device package and a method of manufacturing the same.

2. Description of the Related Art

Various techniques for packaging integrated circuit (IC) chips or semiconductor device chips integrated with ICs have been suggested in the semiconductor manufacturing arts. The increase of the integration density in semiconductor devices has led to the popularity of bump pad technology, particularly having a small pitch. Minimized and/or portable electronic appliances employing semiconductor device packages impose strict restrictions on the height of the resulting IC packages.

As the height, or bonding surface area, of a bump is decreased to conform with such height restrictions, device reliability is degraded. Also, when etching an Under Bump Metal (UBM) mounted as a lower layer of the bump after forming the bump, an undesirable under cut may occur. Such an under cut of the UBM is regarded as lowering the bonding force of the bump and degrading electrical reliability of the bump.

FIG. 1 is a sectional view illustrating a bump structure of a conventional semiconductor device.

Referring to FIG. 1, the conventional bump structure is formed by carrying out a semiconductor device manufacturing process on a wafer or a semiconductor substrate 10, and then performing a bump manufacturing process. A bump pad 20 disposed on the semiconductor substrate 10 is composed of a metal such as Al, which is electrically connected to an interconnect of the semiconductor device during an interconnecting process of the semiconductor device.

A passivation layer 30 partially exposing a surface of the bump pad 20 is formed, and a UBM 40 electrically connected to the bump pad 20 exposed by the passivation layer 30 is formed. The passivation layer 30 may be composed of polyimide. Thereafter, a resist pattern (not shown) exposing the UBM 40 on the bump pad 20 is introduced, and a bump 50 is formed on the UBM 40 exposed by the resist pattern using electroplating, etc. Then, the resist pattern is removed, and a portion of the UBM 40 exposed by the bump 50 is selectively removed, thereby completing the bump structure.

At this time, the selective removal of the exposed UBM 40 is performed using isotropic etching such as wet etching. When performing the wet etching, an undercut 60 is liable to occur in the UBM 40. The under cut 60 decreases a bonding area between the bump 50 and an underlying layer, thereby degrading the reliability of the bump 50. The decreased bonding force of the bump 50 causes a significant problem if a smaller bump size or bump pad pitch is required.

Currently, as the electronic appliances employing the semiconductor device packages are further reduced in size, especially for portable use, the package needs to be produced with a smaller height. However, if the height of the bump 50, for example the height of the FIG. 1 bump structure, is reduced, the reliability to the bump is likely to become degraded. Therefore, in order to embody a stable electrical connection in the reduced-height package, the bump 50 is required to have a diameter or a thickness greater than a prescribed level. Therefore, the restriction in the decrease of the bump thickness operates as a final factor that impedes further reduction of the package thickness.

SUMMARY OF THE INVENTION

The present invention provides a bump structure of a semiconductor device and a manufacturing method thereof for increasing a bonding force of a bump in a package, and for preventing an under cut from being formed in an under bump metal layer (UBM).

In one aspect, the present invention is directed to a method of manufacturing a bump of a semiconductor device comprising: forming a groove in a bump pad region of a semiconductor substrate; forming an under bump metal layer in the groove; and forming a bump with a lower end portion filling the groove on the under bump metal layer.

In one embodiment, the method further comprises providing a semiconductor device on the semiconductor substrate.

In another embodiment, the method further comprises forming a bump pad for the bump within the groove.

In another embodiment, the method further comprises forming a passivation layer on the semiconductor substrate to expose a surface of the bump pad.

In another embodiment, the method further comprises selectively removing a portion of the under bump metal layer exposed by the bump.

In another embodiment, the method further comprises reflowing the bump.

In another embodiment, the groove is formed to have a depth ranging from several µm to several tens of µm. In another embodiment, the groove is formed by selectively etching the semiconductor substrate.

In another embodiment, forming the under bump metal layer forms the under bump metal layer on sidewalls and a bottom of the groove.

In another aspect, the present invention is directed to a method of manufacturing a bump of a semiconductor device comprising: forming a mask pattern on a bump pad region of a semiconductor substrate; selectively growing an epitaxial growth layer on the semiconductor substrate exposed by the mask pattern; selectively removing the mask pattern to form a groove surrounded by the epitaxial growth layer in the semiconductor substrate; forming an under bump metal layer in the groove; and forming the bump with a lower end portion filling the groove on the under bump metal layer.

In one embodiment, the method further comprises providing the semiconductor device on the epitaxial growth layer.

In another embodiment, the method further comprises forming a bump pad for the bump within the groove.

In another embodiment, the epitaxial growth layer is formed to a thickness of allowing the groove to have a depth of several µm to several tens of µm.

In another embodiment, forming the under bump metal layer forms the under bump metal layer on sidewalls and a bottom of the groove.

In another aspect, the present invention is directed to a bump structure of a semiconductor device comprising: a semiconductor substrate including a groove in a bump pad region of the semiconductor substrate; an under bump metal layer on sidewalls and a bottom of the groove; and a bump with a lower end portion filling the groove formed on the under bump metal layer.

In one embodiment, the groove extends into the semiconductor substrate.

In another embodiment, the groove is surrounded by an epitaxial growth layer selectively grown on the semiconductor substrate.

In another embodiment, the bump structure further comprises a bump pad formed for the bump within the groove.

In another embodiment, the groove has a depth of several μm to several tens of μm.

In accordance with the present invention, the bonding force of a bump in a semiconductor package can be increased, and an under cut that otherwise is formed in a UBM can be prevented.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete.

Embodiments of the present invention provide a bump structure and a manufacturing method thereof, in which a height of a bump with respect to a semiconductor substrate or a layer formed with the semiconductor device thereon can be relatively lowered while a relatively large diameter or thickness of the bump is maintained. For example, a groove is formed in a semiconductor substrate or in a layer where a semiconductor device is formed. Then, a lower end portion of the bump is buried within the groove, so that the height of the bump is substantially decreased and a bonding area between the bump and the semiconductor substrate, or the layer formed with the semiconductor device thereon, is relatively enlarged to increase the bonding force of the bump.

By doing so, the bonding area of the bump can be widened even in conditions where a small bump pad pitch is required. Also, a relatively large thickness and diameter of the bump can be maintained. Thus, the reliability of the bump structure can be increased, and the above-described restriction imposed on further reduction of the package thickness can be alleviated. Consequently, a much thinner semiconductor device package can be manufactured. Furthermore, since the lower end portion of the bump is partially buried in the groove, the under cut identified above that is produced in the UBM of the conventional architecture, and the degraded reliability resulting from the under cut, can be effectively prevented.

FIGS. 2 through 6 are sectional views illustrating a bump of the semiconductor device and a manufacturing method thereof according to a first embodiment of the present invention.

Figure 1:
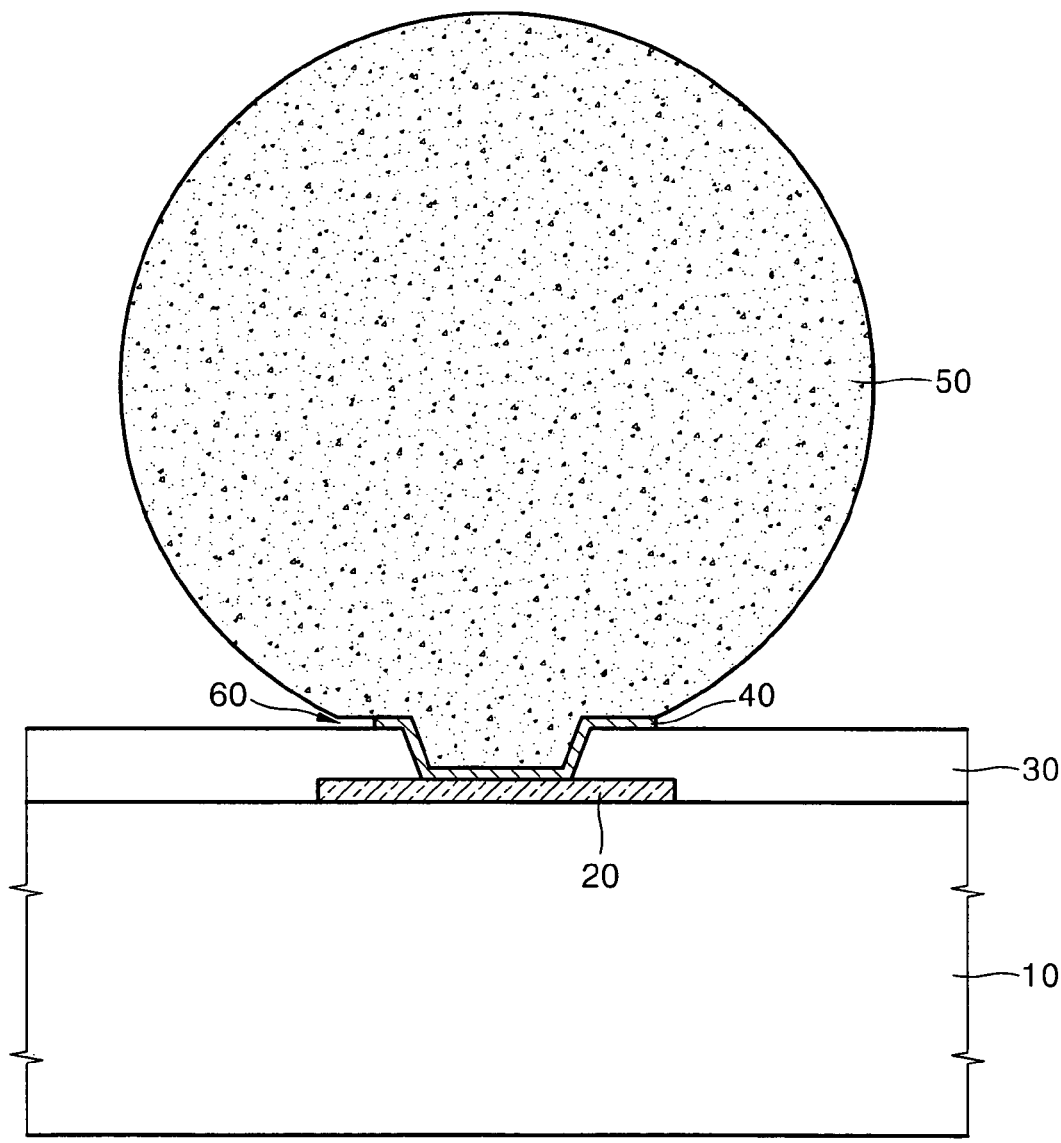
FIG. 1 is a sectional view illustrating a bump structure of a conventional semiconductor device.
Figure 2:
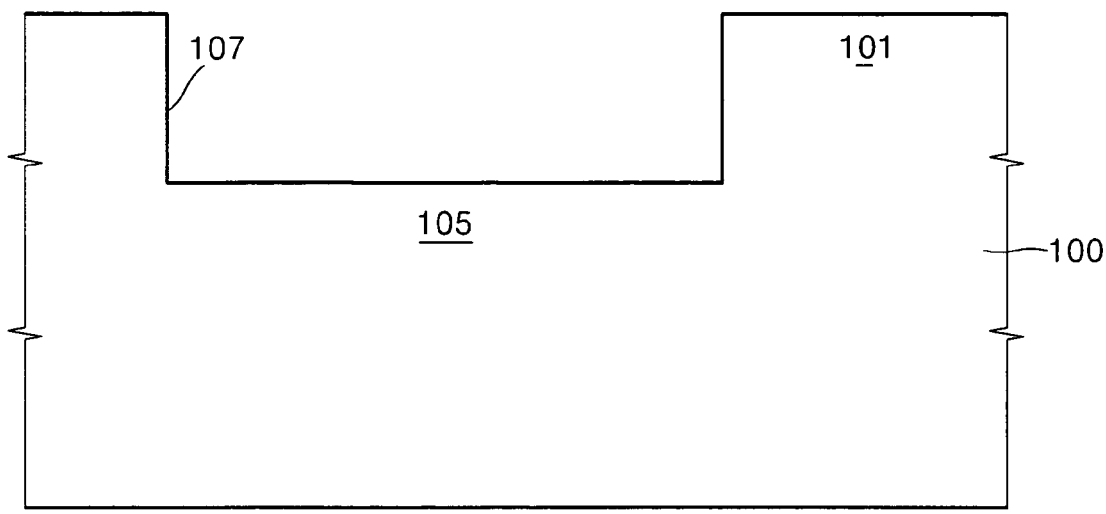
FIGS. 2 through 6 are sectional views illustrating a bump structure of a semiconductor device according to a first embodiment of the present invention.

Referring to FIG. 2, a groove 107 in which a lower end portion of a bump will be partially buried is formed in a wafer or a semiconductor substrate, e.g., a silicon semiconductor substrate 100. That is, the groove 107 is formed in a bump pad region 105 of the semiconductor substrate 100 where the bump will be formed or bonded. The groove 107 may have a deep trench geometry, and may be placed where the bump pads are formed when considering the structure of the semiconductor device.

A depth of the groove 107 is determined in consideration of the thickness and the diameter of the resulting desired bump, which is several μm to several tens of μm deep. The groove 107 can be formed to be several tens of μm deep when considering the height of the resulting bump in one example, when the thickness or diameter of the bump is assumed as 100 μm to 70 μm, the depth of the groove 107 is approximately on the order of 10 μm.

The groove 107 can be formed prior to forming a bump pad that will be formed during an interconnect forming process of the semiconductor device. In more detail, before the semiconductor device is formed on a device region 101 where the semiconductor device including transistors or/and capacitors and interconnects will be formed, etching is selectively performed in the bump pad region 105 to form the groove 107 for receiving the bump thereon. Therefore, a bottom of the groove 107 is stepped relative to an upper surface of the device region 101.

Figure 3:
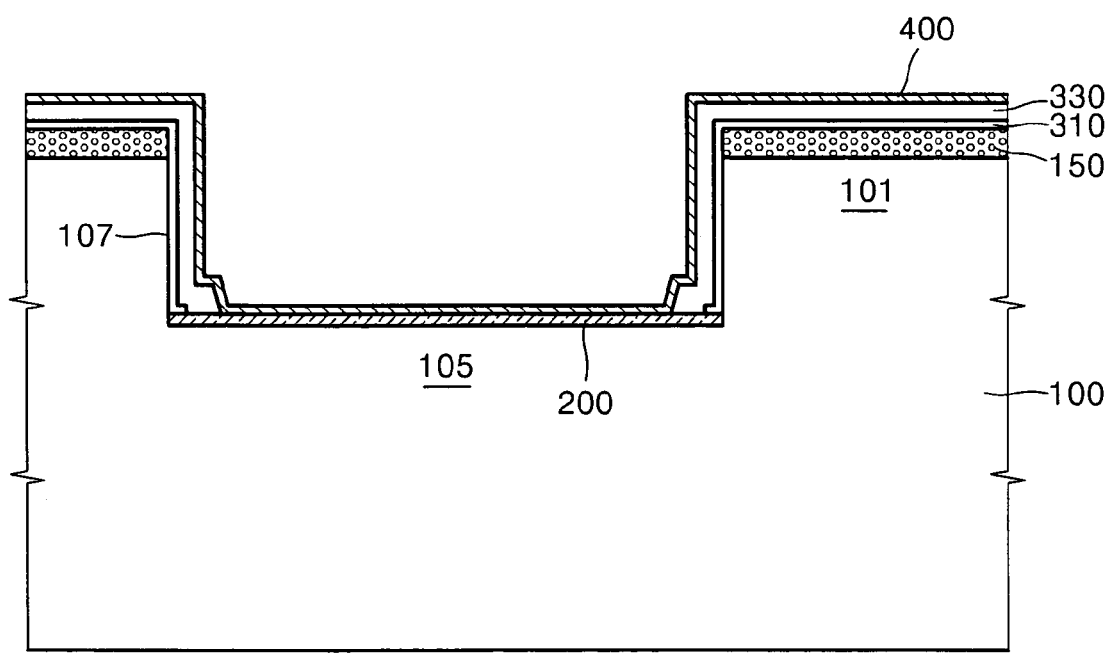

Referring to FIG. 3, a bump pad 200 is formed within the groove 107. The semiconductor device is embodied on the semiconductor substrate 100, i.e., substantially the device region 101, formed with the groove 107. That is, a semiconductor device forming process including forming transistor devices and/or capacitors, and diverse interconnects is carried out. By doing so, a device layer 150 is embodied on the semiconductor substrate 100.

The device layer 150 obtained by forming such devices may be understood as a structure including diverse devices, interconnects and insulating layers for insulating these elements. The device layer 150 is placed only on the device region 101 in FIG. 3, but can optionally extend to the inside of the groove 107 in view of the characteristics of the semiconductor process. Even in the case where the device layer 150 extends to within the groove 107, the step formed between the device region 101 and the bump pad region 105 can be maintained.

On the other hand, the bump pad 200 electrically connected to the interconnect during the interconnect forming process of forming the semiconductor device is formed within the groove 107. Since the bump is provided to electrically connect the devices embodied within the device layer 150 to an external circuit, the bump pad 200 electrically connected to the bump is also electrically connected to the interconnect formed within the device layer 150. The bump pad 200 is preferably formed to be relatively wide and in the bottom of the groove 107 to define a contact area electrically connected to the bump with the lower end portion partially buried in the groove 107.

The bump pad 200 may be formed during the interconnect forming process, and thus may be formed by including a metal layer such as Cu and Al constituting the interconnect.

After forming the bump pad 200, an insulating layer 310 covering the device layer 150 is formed. Then, the insulating layer 310 is selectively etched to open a surface of the bump pad 200. A passivation layer 330 including polyimide is formed on the insulating layer 310. Thereafter, the passivation layer 330 is selectively etched to selectively open the surface of the bump pad 200.

Subsequently, a UBM 400 for plating the bump is formed on the passivation layer 330. The UBM 400 is used as a lower layer for performing electro-plating.

Figure 4:
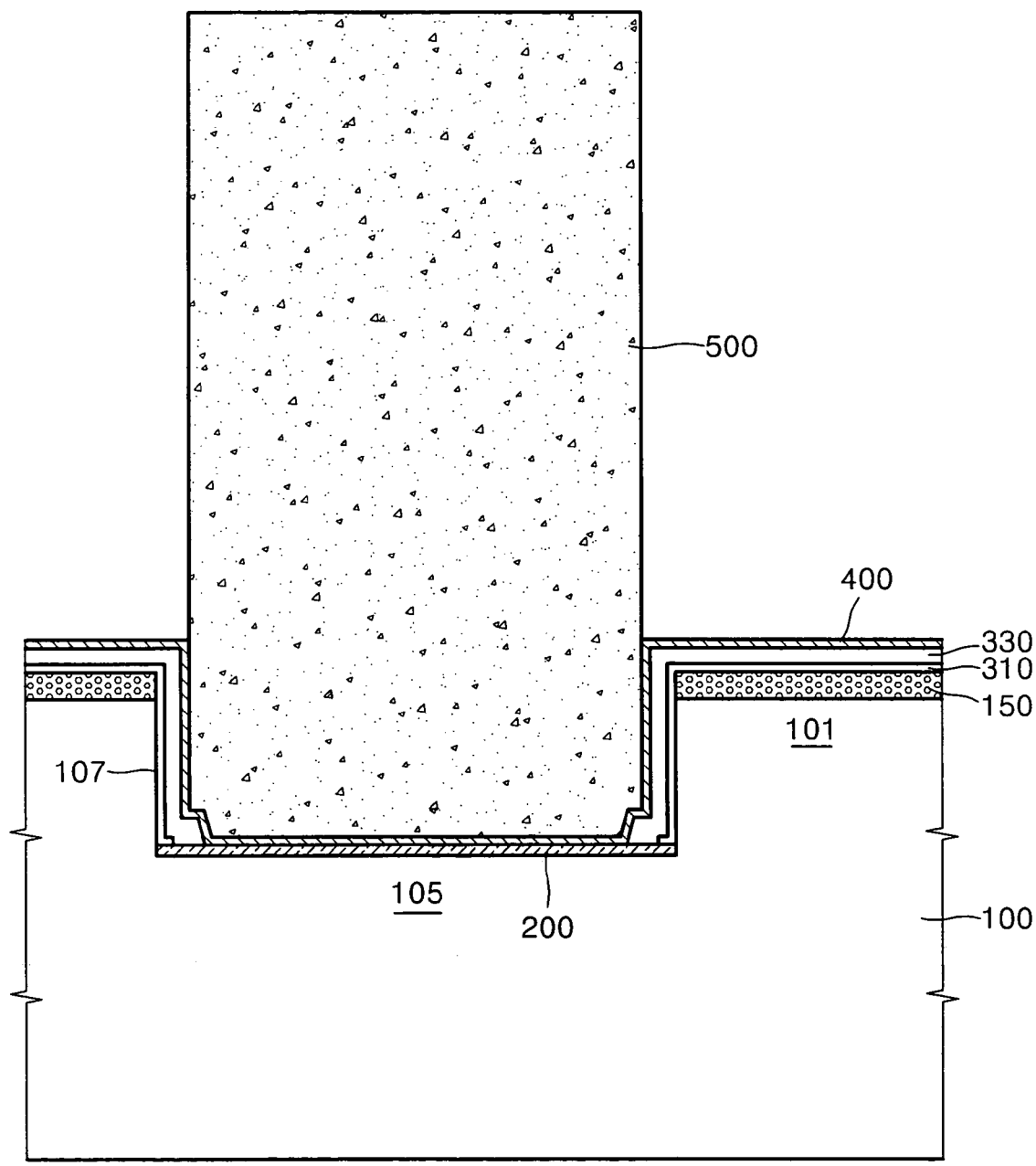

Referring to FIG. 4, after forming a resist pattern (not shown) that exposes the groove portion on the UBM 400, a bump 500 is formed. The bump 500 can be formed, for example, using electroplating and can be composed of solder, Cu or Au. In one example, the bump 500 can be formed to a thickness of about several tens of μm to 100 μm.

Here, a lower end portion of the bump 500 is formed to fill the groove 107. Therefore, a contact area between the bump 500 and the UBM 400 extends to the sidewall and the bottom of the groove 107, thereby widening the contact area. For this reason, a bonding force of the bump 500 is further increased. Moreover, the lower end portion of the bump 500 fills the groove 107, so that the height of the bump 500 is significantly decreased depending on the depth of the groove 107 while maintaining the thickness of the bump. Accordingly, the height of the bump 500 can be adjusted by, controlling the depth of the groove 107. Thus, the height or thickness of the semiconductor device package can be decreased to be favorable for portable systems. Following formation of the bump material, the resist pattern is selectively removed.

Figure 5:
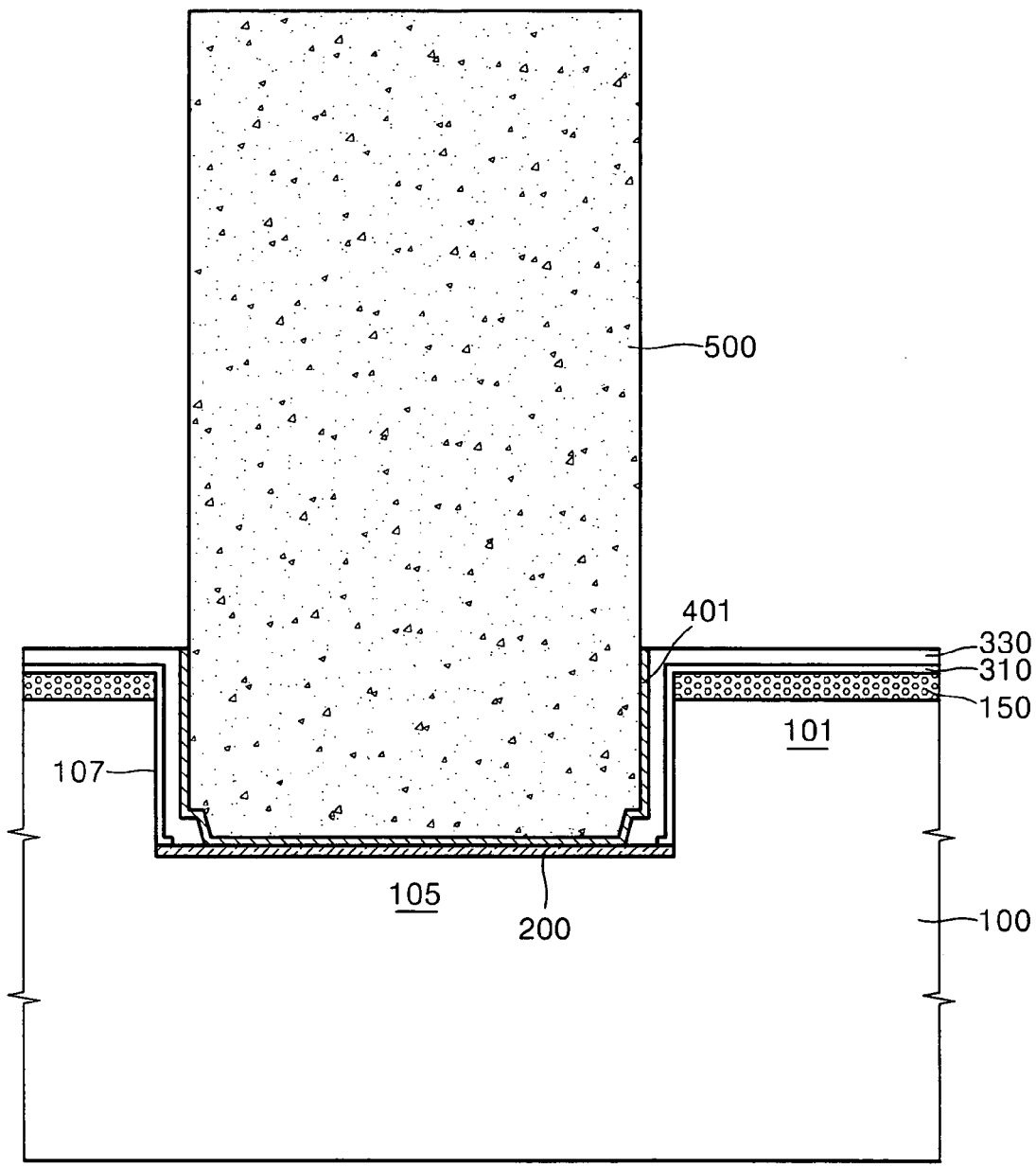

Referring to FIG. 5, using the bump 500 as a mask, the exposed UBM 400 portion is selectively removed. By doing so, a UBM portion 401 covered by the bump 500 is left. Because the remaining UBM portion 401 is in contact with the sides of the lower end portion of the bump 500, the under cut identified above in connection with the conventional embodiment, that otherwise would occur, is prevented in the present invention. Additionally, although the contact portion of the bump 500 and the UBM portion 401 is partially removed by selective etching, the bump 500 is not detached. Therefore, the under cut is inhibited and the bonding force is improved.

By patterning the UBM portion 401 as described above, the bump structure is provided as projecting from the trench formed in the semiconductor substrate 100.

Figure 6:
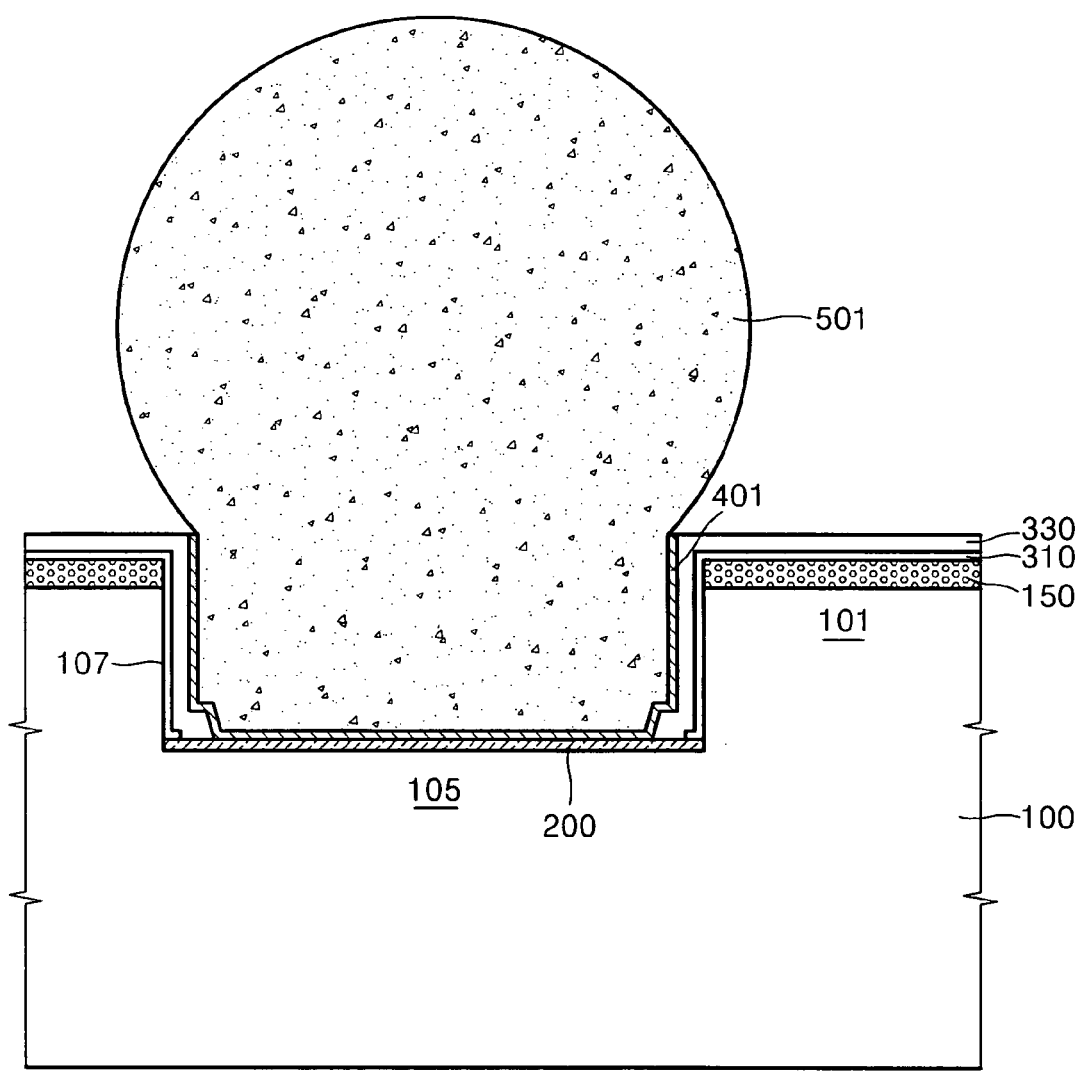

Referring to FIG. 6, the bump 500 is reflown to have a ball shape 501, as shown.

The groove 107 can be formed as described above, and the lower end portion of the bump 500 is partially buried in the groove 107 to maintain the thickness of the bump, while, at the same time, decreasing the height of the bump 500. In alternative embodiments, the groove 107 can be formed in the semiconductor substrate 100 using selective etching, or formed by selectively forming the semiconductor layer on the substrate using selective epitaxy.

Figure 7:
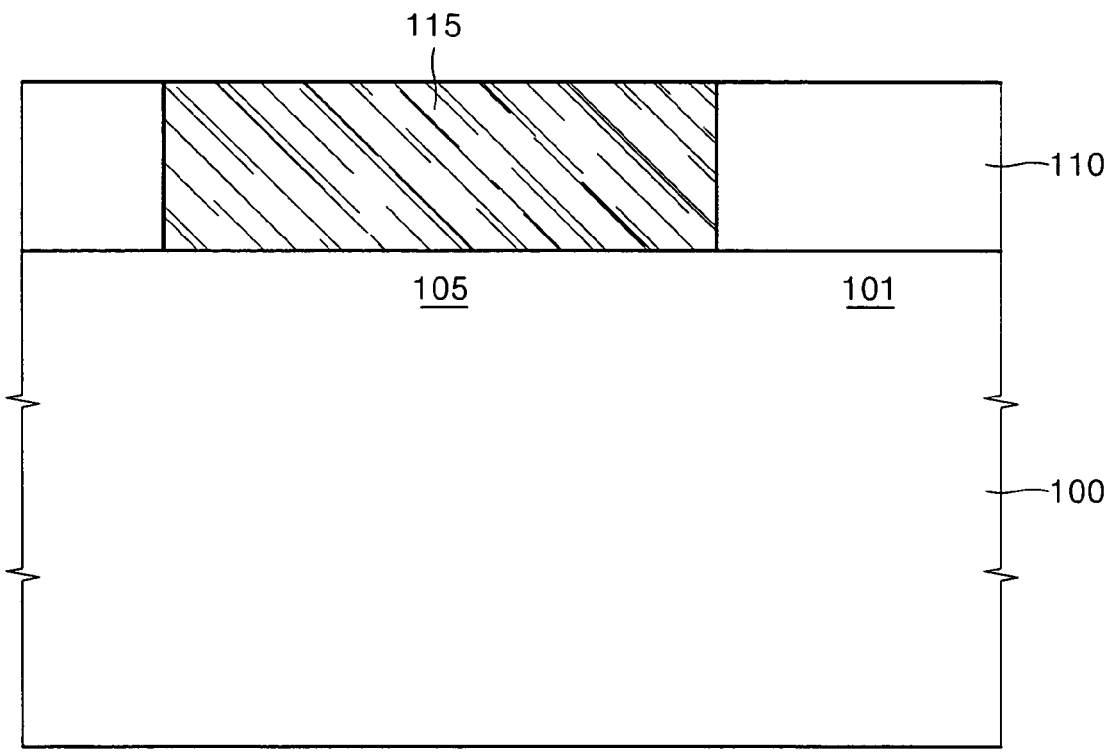
FIGS. 7 through 9 are sectional views illustrating the bump structure of the semiconductor device according to a second embodiment of the present invention.
Figure 8:
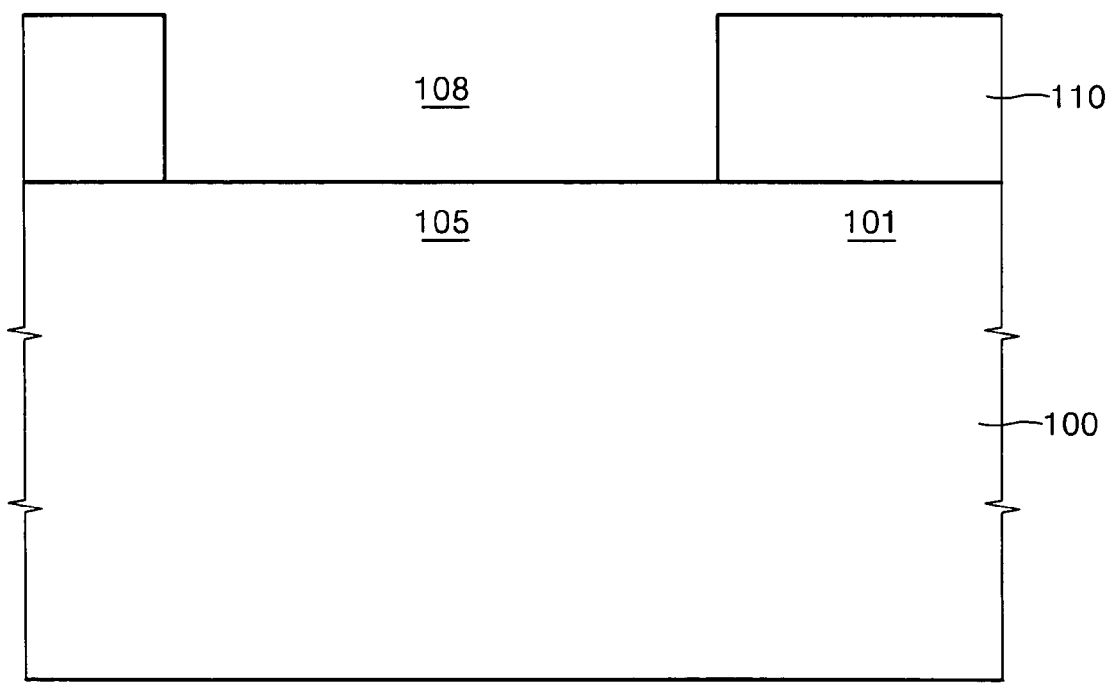
Figure 9:
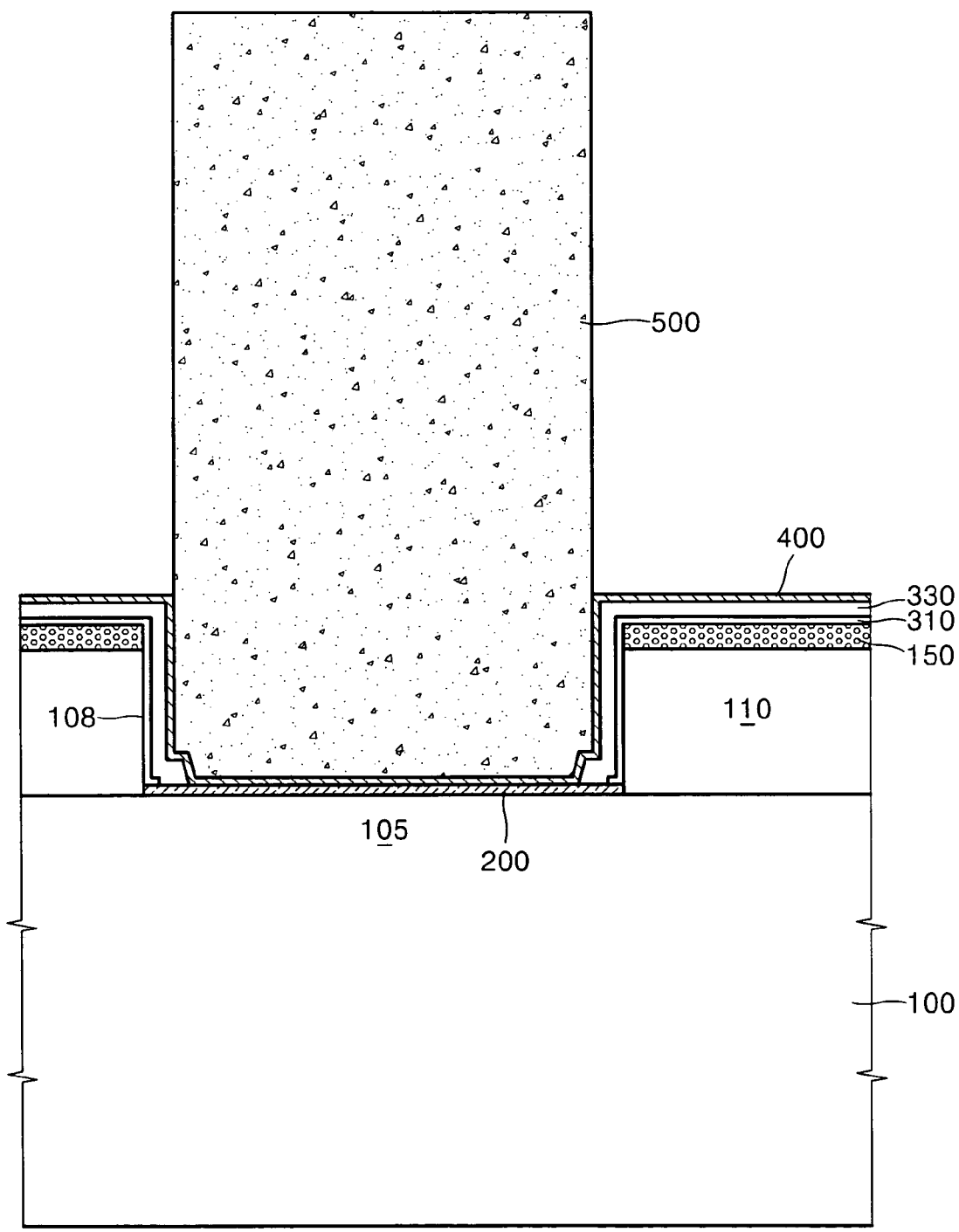

FIGS. 7 through 9 are sectional views illustrating a bump structure of a semiconductor device according to a second embodiment of the present invention.

Referring to FIG. 7, a mask pattern 115 as a sacrificial layer for forming the groove is formed on a bump pad region 105 of a semiconductor substrate 100 or Silicon On Insulator (SOI) substrate to which a bump is formed or attached. The mask pattern 115 is formed to cover the bump pad region 105 and to expose a device region 101 where the device will be formed. The mask pattern 115 can optionally be composed of an insulating material such as silicon oxide or silicon nitride. Also, the thickness of the mask pattern 115 is determined by considering the resulting depth of the desired groove to be formed.

Thereafter, a selective epitaxial growth procedure is performed to the silicon surface of the semiconductor substrate 100 exposed by the mask pattern 115, thereby forming a semiconductor layer 110 on which devices will be formed. Preferably, the semiconductor layer 110 is grown by a single-crystalline silicon layer; however, other growth techniques may be employed.

Referring to FIG. 8, the mask pattern 115 is selectively removed to form a groove 108. A surface of the semiconductor substrate 100 which is the bottom of the groove 108 and an upper surface of the semiconductor layer 110 have a step as deep as the groove 108. The groove 108 substantially operates as the groove (107 of FIG. 2) formed by selective etching to the semiconductor substrate 100 as shown in FIG. 2.

Consequently, the depth of the groove 108 depends on the thickness of the mask pattern 115 and/or a thickness of the semiconductor layer 110 formed by epitaxial growth. Also, the depth of the groove 108 is determined by considering the thickness or diameter of the bump, which may be several μm to several tens of μm. When the thickness or the diameter of the bump is approximately 100 μm to 70 μm, the depth of the groove 107 may be approximately on the order of 10 μm.

As described above with reference to FIG. 2, the groove 108 is formed before forming a bump pad that will be formed during an interconnect forming process of the semiconductor device.

Referring to FIG. 9, a bump pad 200 is formed within the groove 108, and a bump 500 is formed thereon. This forming process is performed as described with reference to FIGS. 3 through 5. However, the semiconductor device forming process such as forming the semiconductor devices, e.g., transistor devices, capacitor devices and/or diverse interconnects, is performed on the grown semiconductor layer 110. By doing so, a device layer 150 is embodied on the semiconductor layer 110.

The device layer 150 resulting from the devices as mentioned above can be understood as a structure substantially including the diverse devices, the interconnects and the insulating layers isolating these various elements. The device layer 150 is disposed on the semiconductor layer 110 in FIG. 9, but can optionally extend to within the groove 108. Even in the case where the device layer 150 extends to the inside of the groove 108, the step formed between the semiconductor layer 110 and the bump pad region 105 is maintained.

The bump pad 100 is formed within the groove 108, and an insulating layer 310 covering the device layer 150 is formed. Then, the insulating layer 310 is selectively etched to open a surface of the bump pad 200. A passivation layer 330 including polyimide is formed on the insulating layer 310, and selectively etched to selectively open the surface of the bump pad 200.

Subsequently, an UBM 400 for plating the bump 500 is formed on the passivation layer 330, and a resist pattern (not shown) that exposes the groove portion is formed on the UBM 400. Then, the bump 500 is formed. The bump 500 may be composed, for example, of solder, Cu and Au, using electroplating. At this time, the bump 500 may have a thickness of about several μm to 100 μm, for example, a thickness of about 60 μm. The resist pattern is then selectively removed. After selectively removing the exposed UBM portion using the bump 500 as a mask, the bump 500 is reflown to have a ball shape, as required.

According to the present invention, a groove in which a lower end portion of a bump will be buried is formed in/on a semiconductor substrate, so that the bump is buried in the groove while projecting from a surface of the substrate. By doing so, a relatively thick thickness of the bump can be maintained, thereby decreasing the height of the portion of the bump that extends above the substrate surface. Furthermore, a bonding area between the bump and the semiconductor substrate (or a layer formed with a semiconductor device) is greatly increased to reinforce the bonding force of the bump. Also, the lower end portion of the bump is buried within the groove, so that an under cut that otherwise would be caused by selective etching of the UBM and the resultant degradation of the bonding force arising from the under cut is prevented.

Consequently, the reliability of the bump is improved even in a highly-integrated semiconductor device package that demands a small bump pad pitch. Moreover, the height of the bump is decreased to allow reduction in the resulting package thickness.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a bump of a semiconductor device comprising:
   forming a groove in a bump pad region of a semiconductor substrate, the groove extending through an upper surface of the semiconductor substrate and having sidewalls and a bottom surface;
   forming an under bump metal layer in the groove directly and physically conductively coupled to the semiconductor substrate at the bottom surface of the groove; and
   forming a bump with a lower end portion filling the groove on the under bump metal layer.

2. The method of claim 1, further comprising providing a semiconductor device on the semiconductor substrate.

3. The method of claim 1, further comprising forming a bump pad for the bump within the groove between, and conductively coupled to, the semiconductor substrate and the under bump metal layer.

4. The method of claim 3, further comprising forming a passivation layer on the semiconductor substrate, and selectively etching the passivation layer to expose a surface of the bump pad.

5. The method of claim 1, wherein forming the under bump metal layer in the groove comprises forming an under bump metal layer in the groove and on other regions of the substrate and further comprises selectively removing an exposed portion of the under bump metal layer from the other regions after forming the bump.

6. The method of claim 1, further comprising reflowing the bump.

7. The method of claim 1, wherein the groove is formed to have a depth ranging from several μm to several tens of μm.

8. The method of claim 1, wherein the groove is formed by selectively etching the semiconductor substrate.

9. The method of claim 1 wherein forming the under bump metal layer forms the under bump metal layer on the sidewalls and the bottom surface of the groove.

10. A method of manufacturing a bump of a semiconductor device comprising:
    forming a mask pattern on a bump pad region of a semiconductor substrate;
    selectively growing an epitaxial growth layer of semiconductor material on the semiconductor substrate exposed by the mask pattern;
    selectively removing the mask pattern to form a groove surrounded by the epitaxial growth layer in the semiconductor substrate;
    forming an under bump metal layer in the groove surrounded by the epitaxial growth layer, the under bump metal layer directly and physically conductively coupled to the semiconductor substrate at a bottom surface of the groove; and
    forming the bump with a lower end portion filling the groove on the under bump metal layer.

11. The method of claim 10, further comprising providing the semiconductor device on the epitaxial growth layer.

12. The method of claim 10, further comprising forming a bump pad for the bump within the groove.

13. The method of claim 10, wherein the epitaxial growth layer is formed to a thickness of allowing the groove to have a depth of several μm to several tens of μm.

14. The method of claim 10 wherein forming the under bump metal layer forms the under bump metal layer on the sidewalls and the bottom surface of the groove.

15. A bump structure of a semiconductor device comprising:
    a semiconductor substrate including a groove in a bump pad region of the semiconductor substrate, the groove extending through an upper surface of the semiconductor substrate and having sidewalls and a bottom surface;
    an under bump metal layer on the sidewalls and the bottom surface of the groove directly and physically conductively coupled to the semiconductor substrate at the bottom surface of the groove; and
    a bump with a lower end portion filling the groove formed on the under bump metal layer.

16. The bump structure of claim 15, wherein the groove is surrounded by an epitaxial growth layer selectively grown on the semiconductor substrate.

17. The bump structure of claim 15, further comprising a bump pad formed for the bump within the groove.

18. The bump structure of claim 15, wherein the groove has a depth of several μm to several tens of μm.

19. The method of claim 10, further comprising reflowing the bump.

20. The method of claim 10, further comprising forming a passivation layer on the semiconductor substrate, and selectively etching the passivation layer to expose a surface of the bump pad.

21. The method of claim 10, wherein forming the under bump metal layer in the groove comprises forming an under bump metal layer in the groove and on other regions of the substrate and further comprises selectively removing an exposed portion of the under bump metal layer from the other regions after forming the bump.

* * * * *